United States Patent
Bemmerl

(10) Patent No.: US 9,484,278 B2
(45) Date of Patent: Nov. 1, 2016

(54) SEMICONDUCTOR PACKAGE AND METHOD FOR PRODUCING THE SAME

(71) Applicant: Infineon Technologies AG, Neubiberg (DE)

(72) Inventor: Thomas Bemmerl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 164 days.

(21) Appl. No.: 14/091,545

(22) Filed: Nov. 27, 2013

(65) Prior Publication Data
US 2015/0145109 A1    May 28, 2015

(51) Int. Cl.
*H01L 23/495* (2006.01)
*H01L 23/31* (2006.01)

(52) U.S. Cl.
CPC ..... *H01L 23/3107* (2013.01); *H01L 23/49541* (2013.01); *H01L 23/49548* (2013.01); *H01L 2224/48091* (2013.01); *H01L 2224/48247* (2013.01); *H01L 2924/1815* (2013.01)

(58) Field of Classification Search
CPC .................... H01L 23/3107; H01L 23/49548; H01L 23/49541; H01L 2924/1815; H01L 2224/48247
See application file for complete search history.

(56) References Cited

U.S. PATENT DOCUMENTS

| | | | |
|---|---|---|---|
| 6,303,997 B1 * | 10/2001 | Lee | H01L 23/13 257/686 |
| 2004/0238923 A1 * | 12/2004 | Lee | H01L 23/3107 257/670 |
| 2014/0103509 A1 * | 4/2014 | Yoon | H01L 23/49816 257/676 |

* cited by examiner

*Primary Examiner* — David Vu
(74) *Attorney, Agent, or Firm* — Murphy, Bilak & Homiller, PLLC

(57) ABSTRACT

A semiconductor package includes a housing having a bottom surface and an upper surface and a solder pad arranged in the bottom surface of the housing. The solder pad includes a solderable through hole. The housing includes an opening extending from the through hole to the upper surface of the housing.

20 Claims, 9 Drawing Sheets

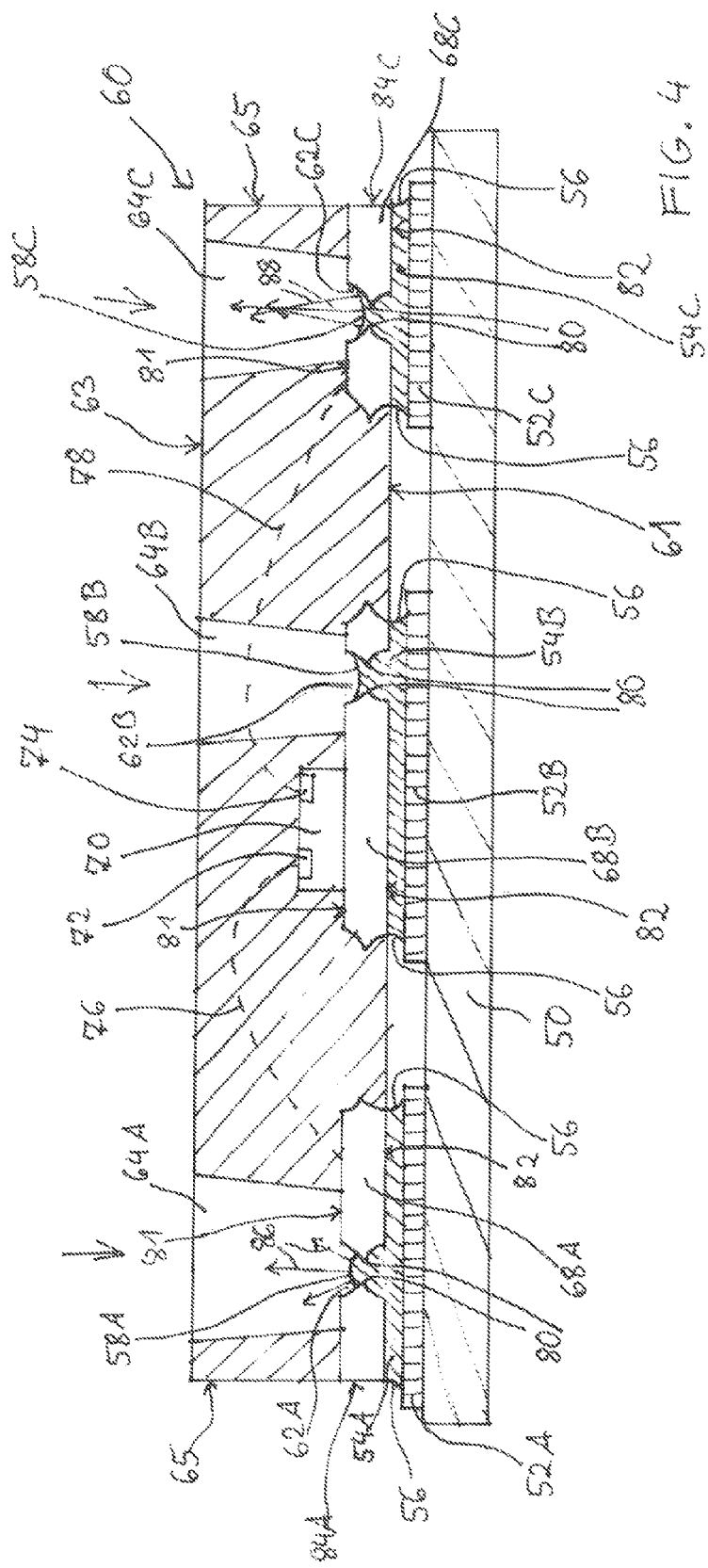

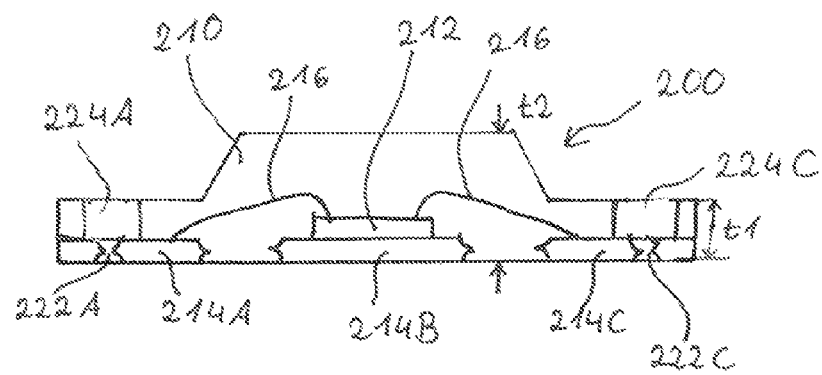
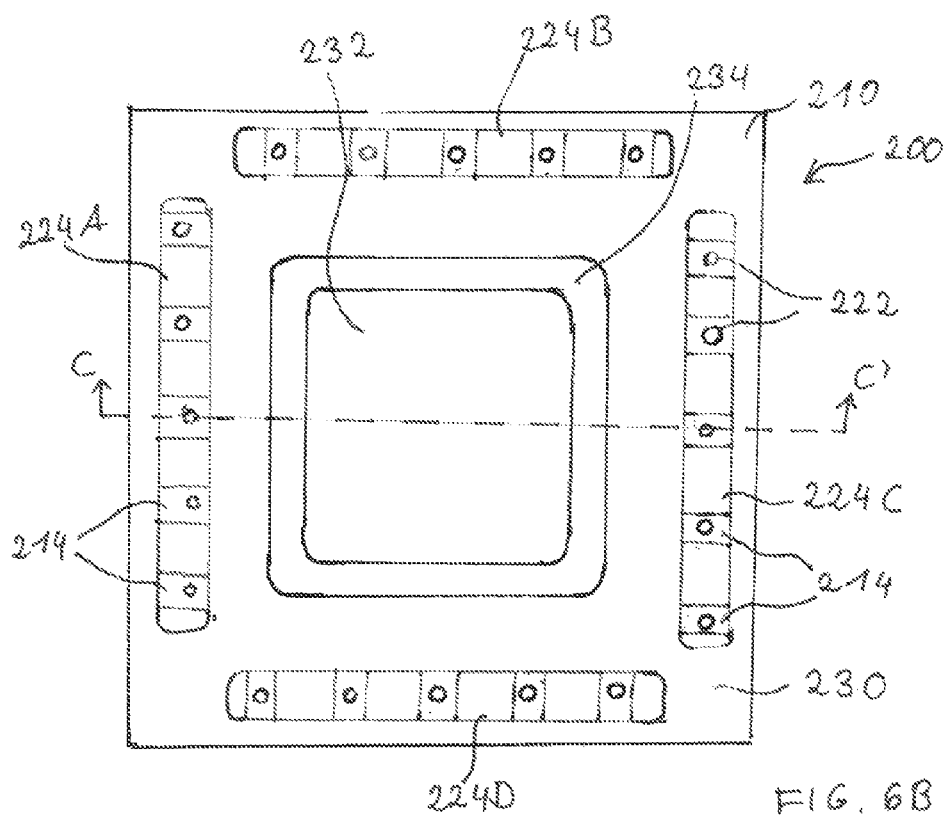

SEMICONDUCTOR PACKAGE AND METHOD FOR PRODUCING THE SAME

TECHNICAL FIELD

The present disclosure relates to semiconductor packages and methods for manufacturing semiconductor packages.

BACKGROUND

Semiconductor packages may be soldered onto a support as for example a printed circuit board. To assure quality of the solder connection, the solder connection may be inspected after the solder process. Visual inspection may be impossible if the soldering joint is hidden by a housing of the package.

BRIEF DESCRIPTION OF THE DRAWINGS

The accompanying drawings are included to provide a further understanding of examples and are incorporated in and constitute a part of this description. The drawings illustrate examples and together with the description serve to explain principles of examples. Other examples and many of the intended advantages of examples will be readily appreciated as they become better understood by reference to the following detailed description. The elements of the drawings are not necessarily to scale relative to each other.

FIG. 4 illustrates a cross-sectional view of the semiconductor package according to FIG. 3 along a line A-A'.

FIG. 6A illustrates a cross-sectional view of a semiconductor package in accordance with the disclosure along a line C-C'.

FIG. 6B illustrates a plan view of the semiconductor package according to FIG. 6A.

DETAILED DESCRIPTION

Figure 1A:
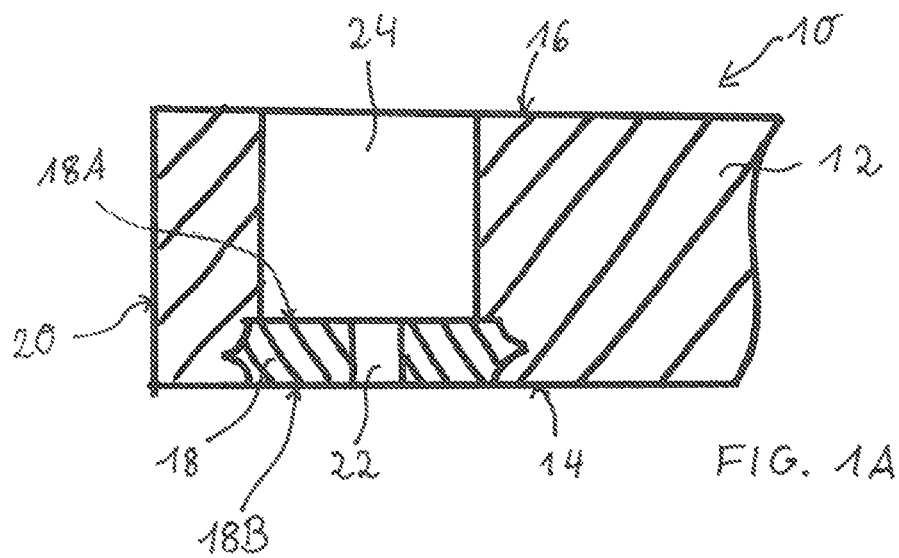
FIG. 1A illustrates a cross-sectional view of a part of a semiconductor package in accordance with the disclosure.

In the following, examples are described with reference to the drawings wherein like reference numerals are generally utilized to refer to like elements throughout. In the following description, for purposes of explanation, numerous specific details are set forth in order to provide a thorough understanding of one or more aspects of examples. However, it may be evident to a person skilled in the art that one or more aspects of the examples may be practiced with a lesser degree of these specific details. The following description is therefore not to be taken in a limiting sense, and the scope of protection is defined by the appended claims.

The various aspects summarized may be implemented in various forms. The following description shows by way of illustration various combinations and configurations in which the aspects may be practiced. It is understood that the described aspects are merely examples and that other aspects and/or examples may be utilized and structural and functional modifications may be made without departing from the scope of the present disclosure. In this regard, directional terminology, such as "top", "bottom", "front", "back", "leading", "trailing", etc., is used with reference to the orientation of the Figure(s) being described. Because components of examples can be positioned in a number of different orientations, the directional terminology is used for purposes of illustration and is in no way limiting. In addition, while a particular feature or aspect of an example may be disclosed with respect to only one of several implementations, such feature or aspect may be combined with one or more other features or aspects of the other implementations as it may be desired and advantageous for any given or particular application.

As employed in this specification, the terms "connected", "coupled", "electrically connected" and/or "electrically coupled" are not meant to necessarily mean that the elements must be directly connected or coupled together. Intervening elements may be provided between the "connected", "coupled", "electrically connected" or "electrically coupled" elements.

Semiconductor packages and methods for manufacturing semiconductor packages are described herein. Comments made in connection with a described semiconductor package may also hold true for a corresponding method and vice versa. For example, if a specific component of a semiconductor package is described, a corresponding method for manufacturing the semiconductor package may include an act of providing the component in a suitable manner, even if such an act is not explicitly described or illustrated in the figures. In addition, the features of the various exemplary aspects described herein may be combined with each other, unless specifically noted otherwise.

Semiconductor packages may include a semiconductor chip or in short a chip. A semiconductor chip may include input/output pads that may be electrically connected to terminals external to the package such as e.g. solder pads. The solder pads may allow a connection of the semiconductor package to a support or more specifically to e.g. contact pads of a printed circuit board by soldering. For example, the solder pads may be arranged on a lead frame. The solder pads may have a thickness between about 0.15 mm and about 0.4 mm. The solder pads may include a first surface and a second surface in electrical contact to one another. The first surface may be opposite to the second surface and distant by the thickness of the solder pad. An electrical connection between the chip and the first surface of the solder pad may e.g. be achieved by wire bonding, tape automatic bonding, flip-chip bonding, etc. Other possibilities to provide an electrical connection are not excluded.

The second surface of the solder pad may provide the terminal to be accessible from the outside of a semiconductor package. Semiconductor packages may be differentiated between leaded and leadless packages. In leaded packages the solder pads or terminals or leads may protrude from an encapsulant material encapsulating the chip in the semiconductor package, whereas in leadless packages the solder pads or terminals may be aligned with or recessed relative to the encapsulant material. Quad Flat No Leads (QFN) packages and Land Grid Arrays (LGA) are examples of leadless packages. Other examples of packages include packages where a die pad may be directly solderable to a printed circuit board. A package having a die pad directly solderable may be a leadless package or may additionally include leads.

A semiconductor package may be mounted on a support, for example a PCB (Printed Circuit Board) that may include contact pads. The terminals of the semiconductor package may be soldered to the contact pads on the PCB, for example in a reflow soldering oven. By the soldering process, a soldering joint may be formed between the terminals and the respective contact pads. Due to variations in characteristics of the soldering process and/or due to contaminations, the quality of the soldering joints may vary. Therefore, soldering joints may be inspected, for example by a so-called lead-tip inspection.

An optical control of soldering joints may be effectuated by a visual inspection from an upper side of the mounted component or semiconductor package when the soldering joint may be visible. The soldering joint may not necessarily be visible if the housing of the component hides the soldering joint. The visual inspection may be based on an electromagnetic spectrum within the optical window which ranges roughly from about 300 nm to about 1100 nm. The visual inspection may be fast, exact and not too expensive. Optical inspection can be done automatically by image processing techniques. A control of soldering joints may further be effectuated by X-ray inspection. The electromagnetic spectrum of X-rays may lie roughly in the range of about 0.01 nm to about 10 nm. X-ray inspection may be slower than the visual inspection, not as exact and more expensive. X-ray inspection may allow an inspection of soldering joints which may be not necessarily visible from above the mounted component.

With the leads being visible from above (as is usually the case for leaded packages), optical inspection may be no problem and the soldering joints can be easily inspected. However, soldering joints which are formed underneath the package (as is usually the case for non-leaded or leadless packages) may only be controlled by X-ray inspection. One example in which a soldering joint is underneath a package may be an exposed die pad. Exposed die pads may be either not controlled for their soldering joint or they may be controlled by X-ray.

FIG. 1A shows a simplified cross-sectional view of a part of a semiconductor package (or package) 10. The package 10 may include a housing 12 which may be formed in a molding process. For example, the molding process may include transfer molding. Transfer molding may be regarded as a molding process in which components may be formed in a closed mold tool from a mold compound. The mold compound may be conveyed under pressure in a hot, plastic state from a transfer pot through tubes into closed cavities. The mold compound thus may encapsulate the chip by forming the housing 12. The encapsulant material or mold compound may e.g. be an insulating material. For example, the encapsulant material may include a dielectric material. In specific examples, the encapsulant material may include at least one of a polymer, a fiber impregnated polymer, a particle filled polymer, other organic materials, etc. The encapsulant may be made of any appropriate duroplastic, thermoplastic, thermosetting material, etc. The material of the encapsulant may include filler materials in some examples. The encapsulant may include epoxy material and filler material including small particles of glass or other electrically insulating mineral filler materials like alumina or organic filler material.

The semiconductor package 10 may include a bottom surface 14, an upper surface 16 and a side surface 20. The distance between the bottom surface 14 and the upper surface 16 may be defined as thickness of the semiconductor package. A solder pad 18 may be arranged at the bottom surface 14. For example, the solder pad 18 may be part of a lead frame. A suitable metal for the lead frame may be copper, however, other materials and even nonmetallic materials may be used alternatively or additionally. A suitable copper-iron alloy which may be used is C194 ESH (Extra Spring Hard). A suitable copper-nickel alloy which may be used is C7025. All structures of the lead frame including the solder pad can be produced in an etching or stamping process, for example. The solder pad 18 may be distant from the side surface 20 of semiconductor package 10. The solder pad 18 may include an upper surface 18A and a lower surface 18B. FIG. 1A merely illustrates a part of the semiconductor package 10. It is understood that the semiconductor package 10 may include a chip that may be encapsulated in the housing 12. An input/output pad of such chip may be electrically contacted to the solder pad 18, and more specifically to the upper surface 18A of the solder pad 18. The electrical contact may e.g. be provided by a wire bond. A thickness of the housing 12, i.e. of the molding compound varies depending on whether a solder pad is covered or not. The thickness of housing 12 may be equal to the thickness of the package, at places where no solder pad is covered and the thickness of housing 12 may be equal to the thickness of the package minus the thickness of the solder pad at places where a solder pad is covered. The thickness of the housing may be again different at places where a chip is covered by the molding compound.

The solder pad 18 may include a through hole 22. The through hole 22 may pass from the lower surface 18B of the solder pad 18, which is not necessarily covered by an encapsulant material of housing 12, to the upper surface 18A of the solder pad 18, which may be arranged inside the housing 12. The solder pad 18 may form a side wall of the through hole 22. The through hole 22 may be formed in the same etching or stamping process used to form the whole lead frame. However, it may also be possible to form the through hole 22 in a separate act on an already stamped out or etched lead frame, e.g. by employing a laser cutting technique. The through hole 22 may have a width between about 0.1 mm and about 0.6 mm. The width of the solder pad may be between about 0.3 mm and about 0.8 mm. The width of the through hole may be chosen dependent on the width of the solder pad. A remaining part of the solder pad surrounding the through hole may have a width of about 0.1 and about 0.15 mm.

For example, the solder pad 18 may be pre-plated. Pre-plating means that a surface of the solder pad 18 may be plated by a solderable material prior to forming the semiconductor package 10. A pre-plating material may provide a surface which may be solder wettable. The pre-plating material may be also provided on the side walls of the through hole 22. For example, suitable pre-plating materials to enhance solderability may include at least one of gold, silver, platinum, zinc, tin, nickel, alloys of these metals, etc. A suitable alloy may be e.g. nickel-palladium-silver/gold. A plating process may be limited to the solder pads or may encompass the whole lead frame. Electroplating may be used to pre-plate the lead frame.

An opening 24 may extend through the encapsulant material, i.e. through the thickness of the housing 12 from the upper surface 18A of the solder pad 18 to the upper surface 16 of the housing 12. A width of the opening 24 may be larger than a width of the through hole 22. The width of the opening 24 may be between about 0.5 mm and about 2.0 mm. A thickness of the housing 12 above the solder pad 18 may be between about 0.2 mm and about 2.0 mm. The thickness of housing 12 may be approximately of the same value than the width of the opening 24. The opening 24 may also be larger than the thickness of the housing 12. For example, the opening 24 may be of an approximately cylindrical form. A cross-section of the opening 24 seen from above the package 10 may e.g. be circular.

In the following examples, the same materials, dimensions and processes described with reference to FIG. 1A may be used.

Figure 2A:
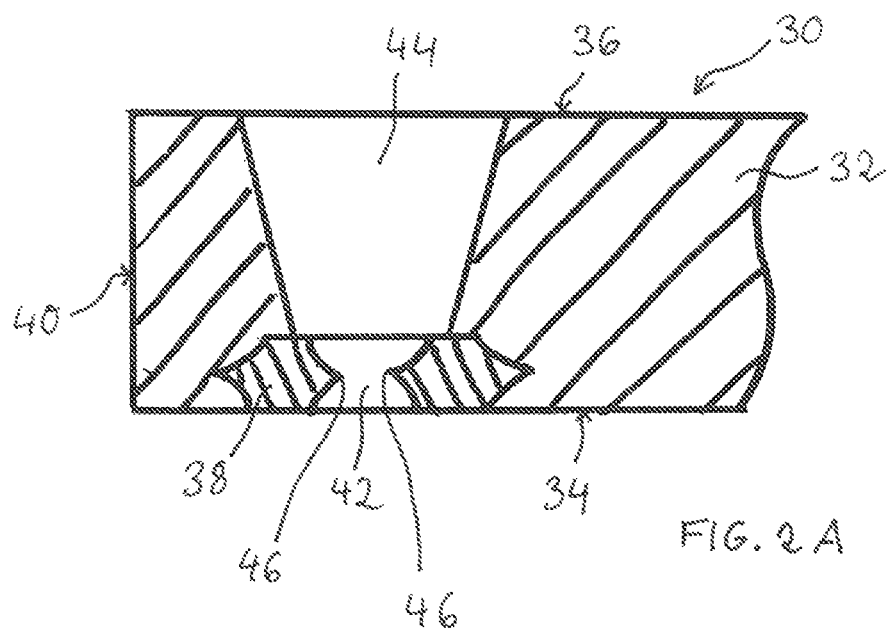
FIG. 2A illustrates a cross-sectional view of a part of a semiconductor package in accordance with the disclosure.

FIG. 2A shows in a second example a semiconductor package 30 with a housing 32 that may be formed from an encapsulant material. The semiconductor package 30 may have a bottom surface 34 and an upper surface 36. In addition, the housing 32 may have a side surface 40. A solder pad 38 may be arranged in the bottom surface 34 of the semiconductor package 30. The solder pad 38 may be similarly formed as solder pad 18 of the first example. The solder pad 38 may be provided with a through hole 42 passing from a lower surface of the solder pad 38 to an upper surface of the solder pad 38. An opening 44 may extend through housing 32 from the through hole 42 to the upper surface 36 of the housing 32. For example, the opening 44 may have a substantially conical form.

In the second example, a projection 46 or protrusion 46 may project into an inner part of the through hole 42. The projection 46 may be formed by etching the through hole 42 into the solder pad 38. An etching may, for example, be performed by first providing a mask on both surfaces of the solder pad 38 defining the place for the through hole 42. Then, an etchant may be provided to both surfaces of the solder pad 38. The etchant may form semi-spherical cavities into the surfaces where no mask protection is provided. The etching may be continued and the two semi-spherical cavities may join into one through hole. The form of the through hole 42 may then be not cylindrical, but shaped according to two semi-spherical forms joined as shown in FIG. 2A. As mentioned with reference to FIG. 1A, the whole lead frame may be formed in an etching process. In FIGS. 1A and 2A, the outer borders of the solder pads 18 respectively 38 may show the same spherical forms as the inner walls of through hole 42 in the second example. They may be formed in the same etching process. However, the projection 46 may be provided by other means as well. The through hole 42 may be provided with a solderable side wall surface. The solder pad 38 including the through hole 42 with the projections 46 may be pre-plated.

Figure 1B:
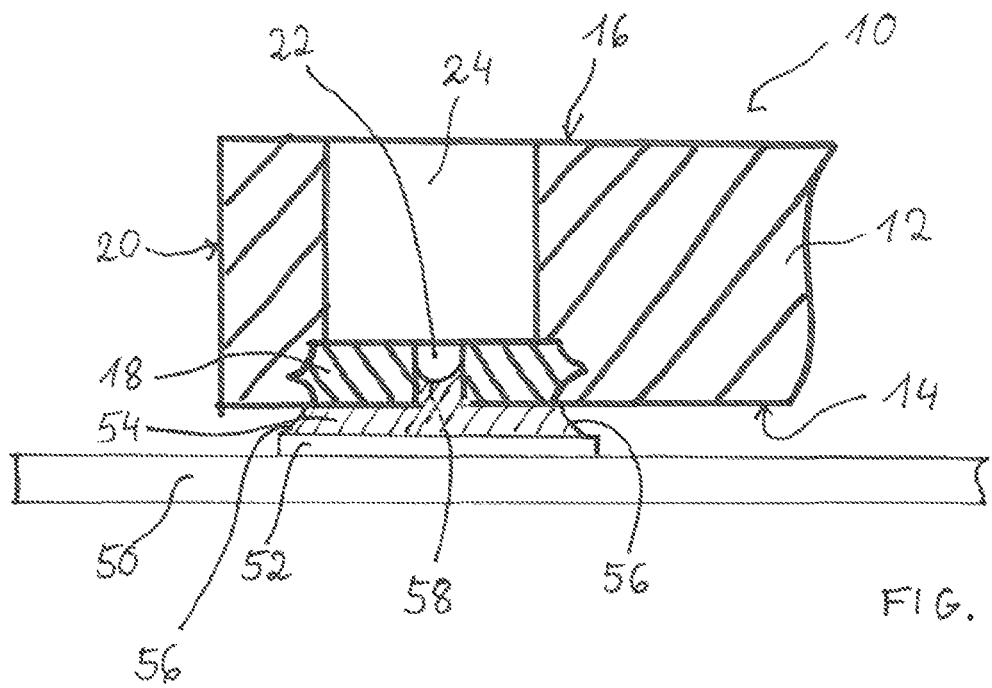
FIG. 1B illustrates a cross-sectional view of the part of the semiconductor package of FIG. 1A soldered to a printed circuit board.

FIG. 1B shows the same part of the semiconductor package 10 of the first example as shown in FIG. 1A. Here, the same reference signs are used. FIG. 1B shows the part of the semiconductor package 10 that may be soldered to a carrier or support 50, which may e.g. be a PCB. On the PCB, a contact pad 52 may be provided. Prior to attaching a semiconductor package 10 to the PCB 50, a soldering paste 54 may be applied to the contact pad 52, for example by a using printing technology. Then semiconductor package 10 may be positioned on the PCB so that solder pad 18 may be arranged on the soldering paste 54. In a reflow process, the soldering paste 54 may be heated and a soldering joint may be formed. The solder may mount in its liquid state into the through hole 22. As through hole 22 may be provided with a solderable or solder-wettable side wall surface, a soldering joint may be formed inside the through hole 22. A solder fillet 56 may form between the solder pad 18 and the contact pad 52. A solder fillet and more precisely the form of a solder fillet may be an indication for the quality of a soldering joint. In a tip lead inspection or in a soldering quality inspection, solder fillets may be inspected. FIG. 1B shows that a solder fillet 58 may form inside the through hole 22 too.

The solder fillet 56 may be not visible from above the semiconductor package 10 or more precisely from the upper surface 16 of the housing 12. The solder fillet 56 may be arranged underneath the housing 12. For example, the solder fillet 56 may only be inspected by X-ray. On the other hand, the solder fillet 58 inside the through hole 22 may be visible from the upper side of the semiconductor package 10 because of the opening 24. The opening 24 may allow an optical view through the housing 12 onto the through hole 22. Although the solder pad 18 may be on the bottom surface of the semiconductor package 10, the solder fillet 58 may allow inspection of the quality of the soldering joint. The solder fillet 58 can be inspected by an optical inspection. No X-ray inspection may be necessary.

Figure 2B:
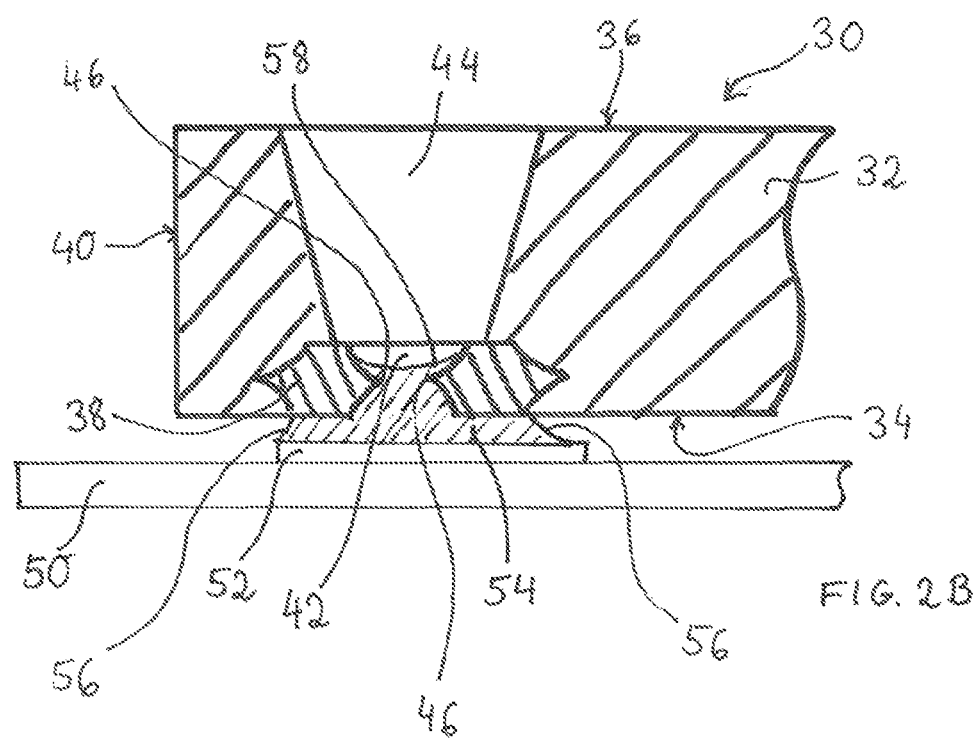
FIG. 2B illustrates a cross-sectional view of the part of a semiconductor package as illustrated in FIG. 2A soldered to a printed circuit board.

FIG. 2B shows the part of the semiconductor package 30 of the second example that may be mounted on the printed circuit board 50. The same reference signs as in FIG. 2A and in FIG. 1B are used. As explained with reference to FIG. 1B, a soldering paste 54 may be applied onto a contact pad 52. In a reflow process the soldering paste may be melted and the soldering paste may enter into the through hole 42. After a cooling down of the solder paste, the solder fillet 56 may form between the contact pad 52 and the solder pad 38. A further solder fillet 58 may form in the through hole 42. The solder fillet 58 may form, because the through hole 42 may have solderable side walls. The opening 44 may allow an optical inspection from the upper side of the semiconductor package 30 of the solder fillet 58.

The solder may fill the through hole 42 above the projections 46. Thus, a locking mechanism may be provided between the solder 54 and the solder pad 38. Therefore, the soldering joint according to the second example does not only provide an electrical contact between the contact pad 52 and the solder pad 38, but also a locking contact.

Figure 3:
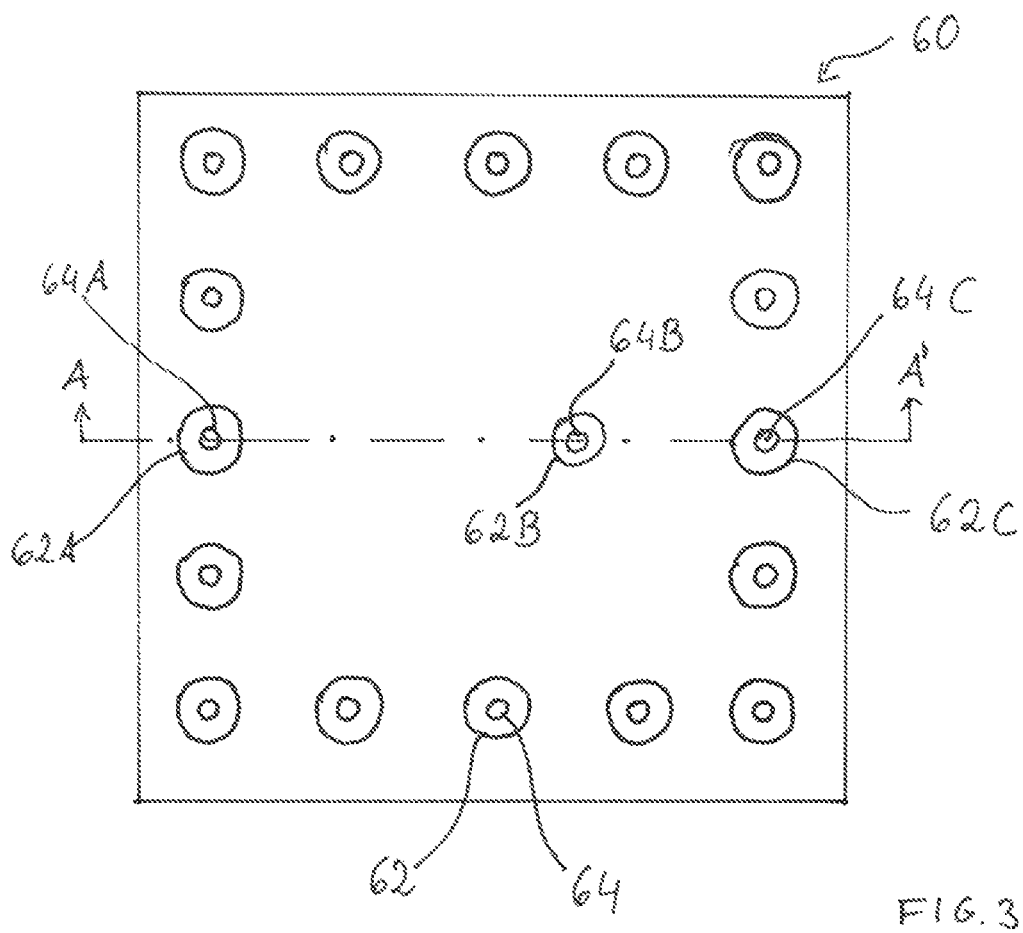
FIG. 3 shows a plan view of a semiconductor package in accordance with the disclosure.

FIG. 3 shows a top view of a semiconductor package 60. The semiconductor package 60 may include e.g. sixteen openings 62, 62A, 62C that may e.g. be arranged along a circumference of the semiconductor package 60 and an opening 62B that may be arranged in a center region of the semiconductor package 60. The openings 62, 62A,B,C may e.g. have a generally circular shape. A diameter or width of the openings 62, 62A,B,C may correspond approximately to the thickness of the semiconductor package 60. The openings 62, 62A,B,C may also have another shape as a rectangular shape, for example. Each opening 62, 62A,B,C may be arranged above a through hole 64, 64A,B,C of a solder pad which is not shown in FIG. 3. Looking onto the semiconductor package 60 from above or in other words from the upper side of the housing may allow to inspect the through holes 64. The through holes 64 may be filled with solder when the semiconductor package 60 is soldered onto a support, for example onto a PCB. It is understood that the number of seventeen through holes 64 corresponding to seventeen solder pads inspectable from above is only an exemplary number. Of course, arbitrary other numbers of solder pads and through holes may be possible.

FIG. 4 shows a cross-sectional view of semiconductor package 60 across line A-A' in FIG. 3 that may be soldered onto a PCB 50. Where applicable, the same reference signs as used in FIGS. 1B and 2B are used. The PCB 50 may include contact pads 52A, 52B and 52C. The semiconductor package 60 may include a bottom surface 61, an upper surface 63 and side faces 65. The semiconductor package 60 may further include three solder pads 68A, 68B and 68C that may be arranged in the bottom surface 61. The solder pad 68A may include the through hole 62A, the solder pad 68B may include the through hole 62B, and the solder pad 68C may include the through hole 62C. A chip 70 may be attached to the solder pad 68B. In other words, the solder pad 68B may be a die pad. The chip 70 may be distant (or remote) from through hole 62B. A solder 54A may be applied onto the contact pad 52A, a solder 54B may be applied to the contact pad 52B, and the solder 54C may be applied to the contact pad 52C.

FIG. 4 further shows in cross-sectional view openings 64A, 64B and 64C. The opening 64A may be situated above the through hole 62A, the opening 64B may be situated above the through hole 62B, and the opening 64C may be situated above the through hole 62C. The chip 70 may be arranged on the solder pad 68B distant from the opening 64B. In other words, the opening 64B may allow a view onto the through hole 62B. The chip 70 may include input/output pads 72 and 74. Input/output pad 72 may be electrically connected to the solder pad 68A by a bond wire 76. Although the bond wire 76 may not be lying in the plane of the cross-sectional view of FIG. 4, the bond wire 76 is indicated by a broken line to visualize the electrical connection. The input/output pad 74 of the chip 70 may be electrically connected to the solder pad 68C. A bonding wire 78 assuring the electrical connection is indicated by a broken line. It is understood that the bond wire 78 is not in the plane of the cross-sectional view of FIG. 4.

Encapsulation material forming the housing 60 may be arranged between the chip 70 and the opening 64B. Therefore, the chip 70 may be still encapsulated in the housing. The opening 64B does not necessarily hinder protection of the chip 70. The bond wires 76 and 78 may be also protected by the encapsulation material. The bonding wire 76 and 78 do not pass an opening. The openings may be arranged such that they do not necessarily interfere with the bond wires shown. They do not necessarily interfere with any bond wires.

The semiconductor package 60 may be soldered to the PCB 50, for example in a reflow soldering process. In its liquid state, the solder paste 54A, 54B, 54C may enter the through holes 62A, 62B and 62C. The through holes 62A, 62B and 62C may each include a portion which may be narrower than the other portions of the through hole. The narrower portion may be formed by projections (or protrusions) 80 which may project into the through holes. The projections may distant (or remote) from a first surface 81 of the solder pads 68A,B,C, and the projections may be distant from a second surface 82 of solder pads 68A,B,C. They may be distant from either end of the through holes. The projections may be formed by etching the through holes 62A,B,C. An etching product may etch generally half-spherical openings from the first surface 81 and from the second surface 82 into the contact pads 68A,B,C. These half-spherical openings may join together approximately in the middle of a height of the contact pads 68A,B,C. In another example, the projections may be formed in another way. The projection, or in other words the bottleneck in the through hole formed by the projections, may provide a locking mechanism.

The solder pads 68A and 68C may include a side surface 84A respectively 84C which may be coplanar to the side faces 65 of the semiconductor housing 60. The side surfaces 84A and 84C may be not necessarily provided with a solderable surface. As already explained with reference to FIG. 1A, the solder pads 68A,B,C may e.g. be part of a lead frame. A lead frame may include a plurality of solder pads of a plurality of semiconductor packages. The semiconductor packages may be formed by a single cavity mold process or a map mold process. In a single cavity mold process, each housing may be molded in a separate cavity. The lead frame may provide an interconnection between the housings at the end of the mold process. In a map mold process, the different housings may be molded in a common mold and separated afterwards. In both cases, the lead frame interconnects may be cut during the separation process. Therefore, the side surfaces of solder pads may not necessarily pre-plated, even if the lead frame is. Therefore, the solder 54 does not necessarily wet the side surfaces 84A and 84C.

The solder 54 may form solder fillets 56 at the borders of the contact pads 52A,B,C and the solder pads 68A,B,C. These solder fillets may not be inspected from above, since package 60 may hinder the view.

Solder 54A,B,C may form solder fillets 58A, 58B and 58C in the through holes 62A,B,C which may be pre-plated such that a soldering joint may be possible. The solder fillets 58A,B,C may be visually inspected by optical means through openings 64A,B,C as indicated by arrows above the openings. In the present example, the solder fillet 58A may be not correctly formed. The solder 54A may not wet sufficiently the side wall of the through hole 62A. Therefore, the solder 54A may form a convex solder fillet 58A. Incident light may be reflected as indicated by arrows 86 in a divergent manner. The optical inspection may conclude a bad soldering joint.

The solder fillets 58B and 58C may have a convex form. The solder may correctly wet the side walls of the through holes 62B and 62C. As indicated by arrows 88 in the opening 64C, incident light may be reflected in a convergent manner. An optical inspection may conclude a soldering joint. It may be not necessary to use an X-ray inspection. The openings may allow optical inspection.

The materials used in the semiconductor package 60, for example copper in the lead frame, silicon in the chip, and a mold compound for the housing may have different temperature coefficients of thermal expansion (CTE). An effect of the different CTEs may be that the housing may tend to bend due to thermal stress. The openings 64 may release the thermal stress and thus may provide a package stress reduction. Hence, it may be a further effect of the openings 64A,B,C that the warpage may be reduced. A further effect may be that a board level reliability may be improved.

As shown in the present example by opening 64B, it may become possible to design solder pads in the middle of a semiconductor package while allowing lead tip inspection for these solder pads. Thus, an increasing number of solder pads does not necessarily necessitate automatically a package size increase. Design possibilities of terminal placements may be enhanced.

Figure 5A:
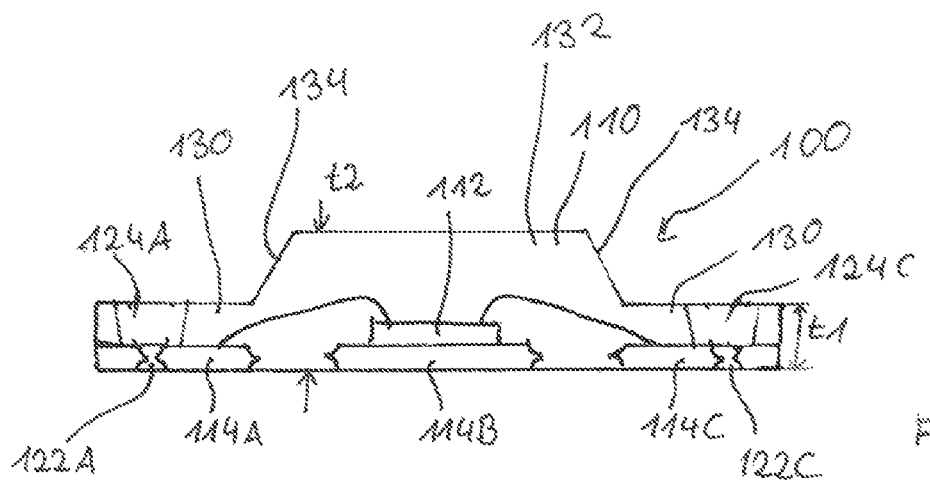
FIG. 5A illustrates a cross-sectional view of a semiconductor package in accordance with the disclosure along a line B-B'.
Figure 5B:
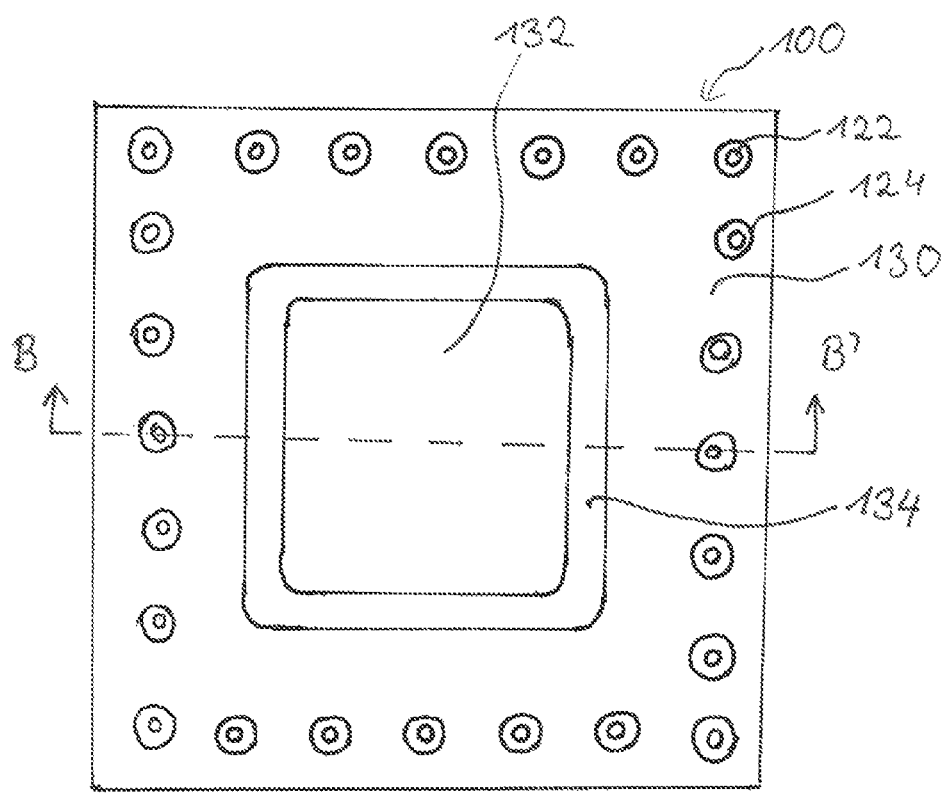
FIG. 5B illustrates a plan view of the semiconductor package of FIG. 5A.

FIGS. 5A and 5B show a fifth example. FIG. 5A is a cross-sectional view across line B-B' in FIG. 5B. FIG. 5B is a top view of a semiconductor package 100. The semiconductor package 100 may include a housing 110, a chip 112 and solder pads 114. The chip 112 may be mounted onto the solder pad 114B. In the fifth example, the solder pad 114B does not necessarily include a through hole providing a possibility of lead tip inspection. It is understood that it may be also possible to design the solder pad 114B in such a way that a through hole may be provided. It may depend on the kind of chip and the number of electrical terminals on the chip and the necessary electrical contacts provided by wire bonding whether a through hole may be provided on a die pad or not.

The solder pads 114A and 114C may each include a through hole 122A respectively 122C. An opening 124A may be arranged above the through hole 122A, and an opening 124C may be provided above the through hole 122C. The openings 124A,C may extend from an upper surface of the solder pads 120A,C to an upper surface of the housing 110. The semiconductor package 100 may have two distinct thicknesses. A first thickness t1 may be provided at the circumference of the housing 110 including the solder pads 114A and 114C. The thickness of housing 110 at the circumference above the solder pads 114A and 114C may be then defined as the thickness t1 of the package minus the thickness of solder pad 114A respectively 114C. The openings 124A,C may be provided in the housing 110 at a place with the first thickness t1 passing through the thickness of housing 110. The further thickness t2 of the semiconductor package 100 may be provided in a center region of the housing 110. The thickness t2 in the center region may be greater than the thickness t1 in the circumference of the housing 110.

In general, the openings 124A,C may have an opening width that may be at least as great as the thickness of the housing 110 through which the openings 124A,C extend. In other words, the opening width may be at least as great as a thickness of the housing 110 above the respective solder pad. The thickness of the housing may be given by the thickness t1 of the package 100 minus a thickness of the solder pad. By lowering the thickness of the package from a thickness t2 to a thickness t1, the openings 124A,C may be smaller while still allowing optical inspection of the through holes. The width of the openings 124A,C is shown in the present example to be larger than the width of the through holes 122A,C. The width of the openings 124A,C may be at least as large as a width of the through holes 122A,C.

FIG. 5B shows that the semiconductor package 100 according to the fifth example may be provided with e.g. twenty-four openings 124 and accordingly with e.g. twenty-four through holes 122 which may be inspected by optical means from above the housing when the semiconductor package may be soldered, e.g. to a PCB. An outer region 130 of the package 100 may have a first thickness t1 while an inner region 132 may have a second thickness t2. The two different thickness regions may be interconnected by a ramp 134.

FIGS. 6A and 6B show a sixth example. FIG. 6B is a top view onto a semiconductor package 200 while FIG. 6A is a cross-sectional view of semiconductor package 200 along a line C-C' in FIG. 6B. The cross-sectional view shown in FIG. 6A of the semiconductor package 200 is similar to the cross-sectional view of the semiconductor package 100 shown in FIG. 5A. The reference signs for the components in FIG. 6A are augmented by 100 compared to the reference signs used in FIG. 5A. The explications for the solder pads 214, the through holes 222, the chip 212 and the wire bonds 216 as well as for the openings 224 and the housing 210 are the same as for FIG. 5A.

The sixth example may differ from the fifth example by the number of provided through holes. The top view in FIG. 6B of the semiconductor package 200 shows twenty contact pads with through holes. In fact, contacts in the corners of a semiconductor package may be more often subject of bad reliability as warpage due to, for example, thermal stress may be more important at the corners. The corners may have a greater distance to the so-called neutral point of a package. As the through holes may allow optical inspection of solder joints, which may be not necessarily at a border of a semiconductor package, it may be possible to design solder pads in the middle of the housing and not to use the package corners for solder pads. This is indicated by the sixth example although the sixth example does not include additional contact pads in an inner region.

The semiconductor package 200 may have two distinct thicknesses t1 and t2, the first thickness t1 being at a circumference of the package and the second thickness t2 being in a center region. The semiconductor package 200 may further differ from the semiconductor package 100 in that only four openings 224A, 224B, 224C and 224D are provided. Each of the openings 224A to 224D may extend through a first thickness of the housing 210 at the circumference, i.e. in a part of the package having the first thickness t1 which may be smaller than the second thickness t2 in a center region of the housing 210. Each of the openings 224A,B,C and D may extend over five through holes through the first thickness of the housing. In other words, each opening 224A,B,C and D may allow an optical inspection of five through holes. The openings 224A,B,C and D may have a generally oblong form. The openings 224 may have a length which may be about 5-10 times the width of the openings 224. Providing one opening for a plurality of through holes, and more specifically for at least two through holes, may have the effect that the housing may be easier to release from a mold cavity at the end of the mold process. The mold release force may be thus reduced. It is understood that the sixth example shows only one possible arrangement of the openings and that, for example, the opening 224A may also be split into two separate openings. The design of the openings may take into consideration the mold release force as well as the intended warpage reduction.

Figure 7A:
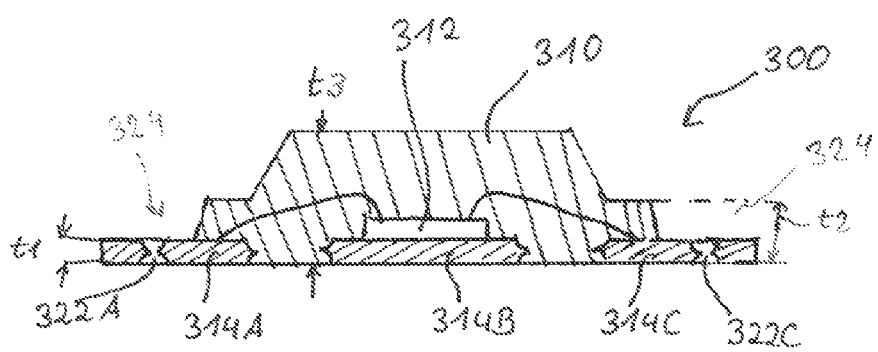
FIG. 7A illustrates a cross-sectional view of a semiconductor package in accordance with the disclosure along a line D-D'.
Figure 7B:
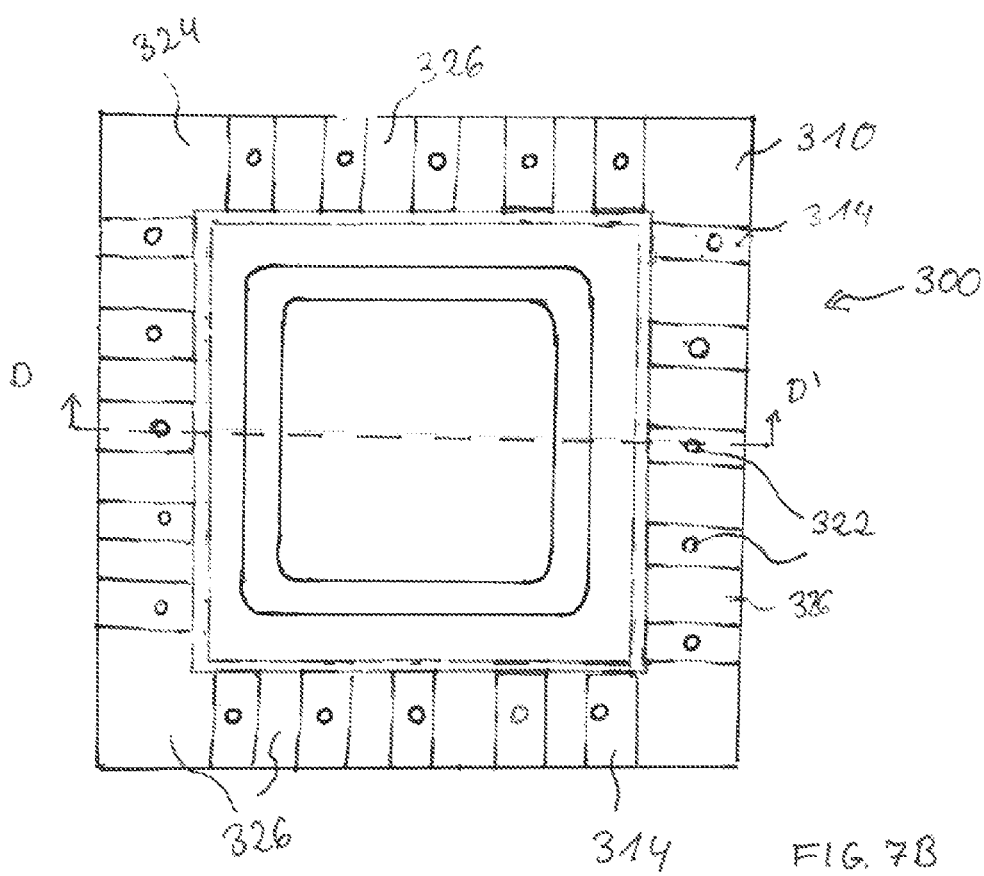
FIG. 7B illustrates a plan view of the semiconductor package according to FIG. 7A.

FIGS. 7A and 7B show a seventh example. FIG. 7B is a top view onto a semiconductor package 300 while FIG. 7A is a cross-sectional view of the semiconductor package 300 along a line D-D' in FIG. 7B. The semiconductor package 300 may include a housing 310, a chip 312 and solder pads 314A, 314B and 314C. The contact pads 314A and 314C may be provided with through holes 322A and 322C. The chip 312 may include a wire bond connection to the solder pads 314A respectively 314C. An opening 324A above the through hole 322A may extend to a side surface of the semiconductor housing 310. An opening 324C arranged above through hole 322C may extend to an opposite side surface of the housing 310. In other words, the openings may be each open to a side surface of the housing 310. The package 300 may have three distinct thicknesses. A first thickness t1 in an outer region may be equal to a thickness of solder pads 314A, 314C, a second thickness t2 in a region adjacent to the outer region which may be larger than the first thickness and a third thickness t3 in an inner region or center region. The third thickness t3 may be greater than the first thickness t1 and greater than the second thickness t2. The first thickness t1 may be smaller than the second thickness t2.

The top view of FIG. 7B shows that the semiconductor package 300 may include e.g. twenty through holes 322 extending through twenty solder pads 314. As the first thickness t1 of package 300 in an outer region is equal to the thickness of the solder pads 314, the solder pads 314 and thus the through holes 322 are directly visible from above. In fact, an opening 324 may have a form of a frame on the outer region of the package 300. The opening 324 may extend through the first thickness of the housing 310 above the solder pads which is equal to the first thickness t1 of the package minus the thickness of the solder pads. As the first thickness t1 equals the thickness of the solder pads, the thickness of the housing 310 above the solder pads is zero. The thickness of the housing, i.e. the mold compound is equal the thickness of the solder pads in-between two adjacent solder pads. The opening 324 may allow an optical inspection of the through holes 322 and may give additionally access to the solder pads 314 from above the housing. The openings 324 may allow electrically contacting the solder pads 314 from above giving the possibility to do electrical testing from the package top side. Electrical testing may be thus possible once the package is soldered to, for example, a PCB. The frame like opening 324 may combine two effects, optical soldering joint inspection via the through holes 322 and electrical testing on the uncovered solder pads 322. At the same time, remaining mold compound of the housing 310 in-between two adjacent solder pads, designated by reference sign 326, may enhance the housing stability compared to a leaded package.

Figure 8:
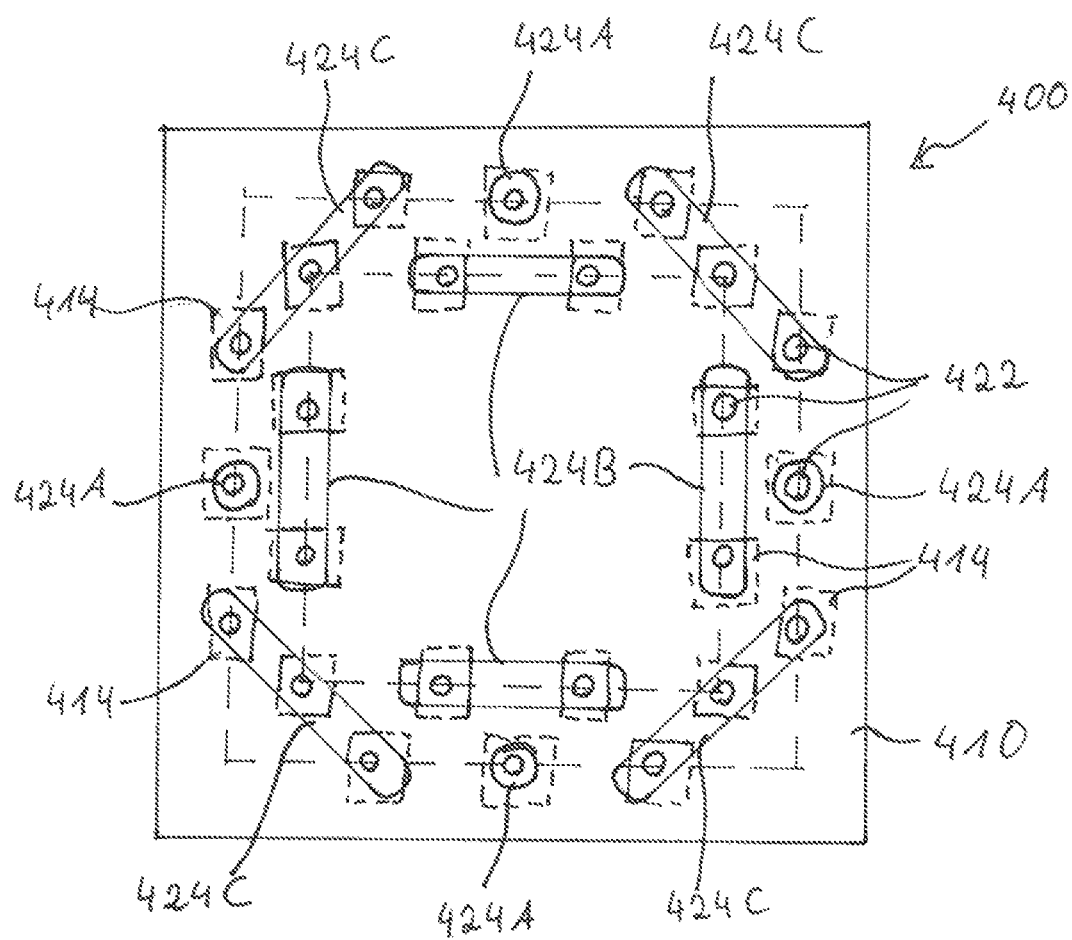
FIG. 8 illustrates a plan view of a semiconductor package in accordance with the disclosure.

FIG. 8 shows in a top view a semiconductor package 400 of an eighth example. The semiconductor package 400 may include e.g. twenty-four through holes 422 which may allow optical inspection of the soldering joint of e.g. twenty-four solder pads 414. The through holes 422 may be accessible to optical inspection through openings 424 that may extend through the thickness of the housing 410. The eighth example demonstrates that the openings may be chosen to satisfy mold release force requirements and/or warpage coefficient requirements. The openings 424 may be independent from the form and orientation of the solder pads 414. In the eighth example, four openings 424A may be generally circular openings as those shown in FIG. 5B, for example, each being arranged above only one through hole. In the example of FIG. 8, four openings 424B may have an oblong form and may extend over two through holes each. Four openings 424C may extend over three through holes each. The through holes may be arranged along two concentric rectangles which are indicated by broken lines. The eighth example demonstrates that a requirement of optical lead tip inspection may not necessitate anymore solder pads arranged around a circumference of a semiconductor package.

It is understood that the different examples described herein may be combined with one another. In addition, it may be possible to provide more than one through hole for one solder pad in any of the previous examples.

Figure 9:
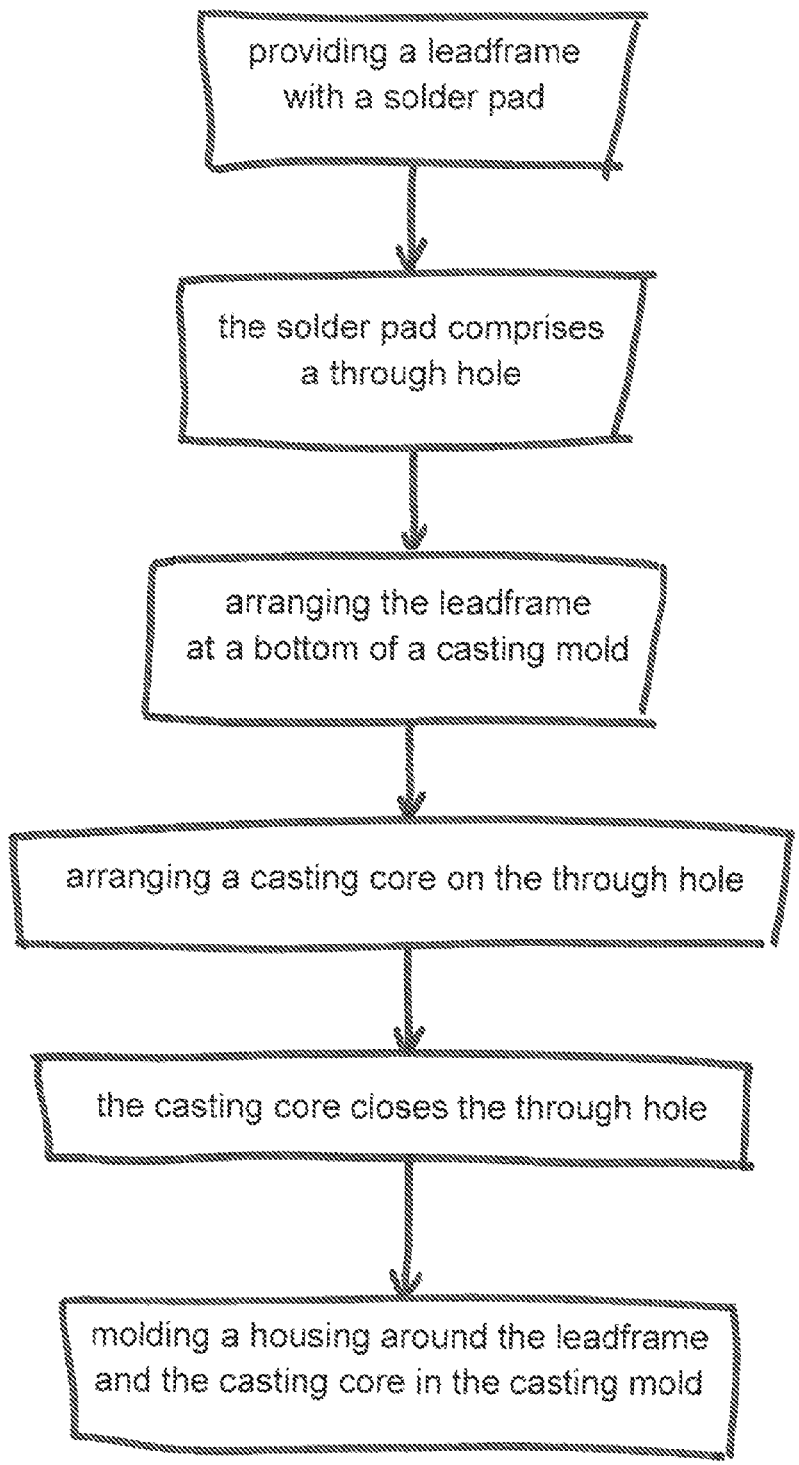
FIG. 9 illustrates a flow chart specifying a method for producing a semiconductor package.

FIG. 9 shows a flowchart specifying a method for producing a semiconductor package as shown in FIGS. 1 to 8. A lead frame may be provided including at least one solder pad. A lead frame may include a plurality of solder pads. One lead frame may include the solder pads for one single semiconductor package. In specific examples, a lead frame may include a multitude of solder pads for a multitude of semiconductor packages.

The at least one solder pad or the multitude of solder pads or a predetermined number of solder pads may include a through hole. For example, the lead frame may be formed from copper. The lead frame may also be formed from any other suitable material. The lead frame may be pre-plated to provide a solderable surface. The at least one through hole may have an inner surface which may be also pre-plated.

The lead frame may be arranged at a bottom of a casting mold. Thus, the solder pad or the plurality of solder pads may be at a bottom surface of the finished semiconductor package.

A casting core may be arranged onto the at least one through hole. In the case of a plurality of through holes, the casting cores for covering the different through holes may be attached one to another. The separate casting cores may be attached one to another outside the final semiconductor package, thus providing separate openings for each through hole, or they may be attached to one another such that one casting core may cover a plurality of through holes inside the later semiconductor package.

The casting core may close the through hole above which it is arranged. The casting core may be covered by a casting film. Film-assisted molding may require a film on the casting mold. A casting core which is covered by a film may close securely the through hole so that no mold compound may enter the through hole.

A housing may be molded around the lead frame and the casting core in the casting mold. For example, the molding process may be a transfer mold process.

If a lead frame is used which may include solder pads for a plurality of semiconductor packages, a separation act may be effectuated after molding.

The following pertains to further examples. Example 1 is a method for producing a semiconductor package. The method may include an act of providing a lead frame including at least one solder pad, wherein the solder pad includes a through hole. The method may further include an act of arranging the lead frame at a bottom of a casting mold. The method may further include an act of arranging a casting core on the through hole, wherein the casting core closes the through hole. The method may further include an act of molding a housing around the lead frame and the casting core in the casting mold.

In Example 2, the subject matter of Example 1 can optionally include that the molding of the housing is effectuated using a film assisted molding.

In Example 3, the subject matter of Example 1 can optionally include that the lead frame includes at least two solder pads, wherein each solder pad includes a through hole, and the casting core covers the at least two through holes.

Example 4 is a semiconductor package that may include a housing including an upper surface and a lower surface opposite the upper surface. The semiconductor package may further include a solder pad arranged within the lower surface of the housing, wherein the solder pad includes a through hole including a side wall configured to provide a solderable surface to a solder inside the through hole. The semiconductor package may further include an opening extending from the solder pad to the upper surface of the housing, wherein the opening is configured to provide an optical view onto the through hole from the upper surface of the housing.

In Example 5, the subject matter of Example 4 can optionally include that the through hole is configured to provide a locking mechanism to the solder inside the through hole.

In Example 6, the subject matter of Example 4 can optionally include that the semiconductor package includes at least two solder pads, wherein each solder pad includes a through hole, and wherein the opening is configured to provide an optical view onto the at least two through holes.

In Example 7, the subject matter of Example 4 can optionally include that the housing includes a thickness, and a width of the opening is about the same value as the thickness in a vicinity of the opening, wherein the thickness of the housing is decreased in the vicinity of the opening.

While the disclosure has been illustrated and described with respect to one or more implementations, alterations and/or modifications may be made to the illustrated examples without departing from the spirit and scope of the appended claims. In particular regard to the various functions performed by the above described structures, the terms (including a reference to a "means") used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the disclosure.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A semiconductor package, comprising:
   a housing comprising a bottom surface and an upper surface; and
   a solder pad comprising:
   a thickness,
   a first main surface and a second main surface,
   wherein the first surface is opposite the second surface and distant from the second surface by the thickness;
   the solder pad arranged in the bottom surface of the housing with the second surface accessible from an outside of the housing,
   wherein the solder pad comprises a hollow and solderable through hole,
   wherein the hollow and solderable through hole extends from the first surface to the second surface through the thickness; and
   wherein the housing comprises an opening extending from the through hole to the upper surface of the housing.

2. The semiconductor package of claim 1, wherein a protrusion protrudes into an inner part of the through hole, wherein the protrusion is arranged distant from either end of the through hole.

3. The semiconductor package of claim 2, wherein the protrusion is formed by an etch process forming the through hole.

4. The semiconductor package of claim 1, wherein the solder pad comprising the through hole is pre-plated.

5. The semiconductor package of claim 1, wherein a width of the through hole is about half of a width of the solder pad.

6. The semiconductor package of claim 1, wherein the opening is substantially circular, and wherein a diameter of the opening is substantially equal or larger than a thickness of the housing in the vicinity of the opening.

7. The semiconductor package of claim 1, wherein a width of the opening extends generally parallel to the solder pad uncovering part of the solder pad.

8. The semiconductor package of claim 1, wherein the opening extends to a side surface of the housing.

9. The semiconductor package of claim 1, further comprising at least two solder pads in the bottom surface of the housing, wherein each of the at least two solder pads comprises a through hole, wherein the opening extends from the through holes of the at least two solder pads to the upper surface of the housing.

10. The semiconductor package of claim 1, wherein the semiconductor package comprises a first thickness in the vicinity of the opening and a second thickness greater than the first thickness.

11. The semiconductor package of claim 1, wherein the solder pad is arranged distant from any side surface of the housing.

12. The semiconductor package of claim 1, wherein the solder pad comprises a die pad, wherein the semiconductor package further comprises a chip attached to an upper surface of the solder pad, and wherein the attached chip is arranged distant from the through hole and from the opening.

13. The semiconductor package of claim 1, wherein the through hole comprises a side wall configured to provide a solderable surface to a solder inside the through hole.

14. The semiconductor package of claim 13, wherein the through hole is configured to provide a locking mechanism to the solder inside the through hole.

15. The semiconductor package of claim 1, further comprising at least two solder pads, each solder pad comprising a through hole, wherein the opening is configured to provide an optical view onto the at least two through holes.

16. A semiconductor package, comprising:
    a housing;
    at least one lead comprising:
    a solder surface configured to be soldered to an external ad arranged underneath the housing,
    and
    an upper surface opposite the solder surface covered by the housing,
    wherein the at least one lead comprises a solder wettable and hollow through hole extending from the solder surface to the opposite surface of the lead;
    wherein the semiconductor package comprises a region with a first thickness and a region with a second thickness greater than the first thickness, and wherein an opening extends through the housing above the through hole in the region of the first thickness.

17. The semiconductor package of claim 16, wherein the semiconductor package further comprises a second thickness greater than the first thickness.

18. The semiconductor package of claim 16, wherein a width of the through hole is smaller than a width of the opening.

19. A semiconductor package, comprising:
a semiconductor chip;
a lead frame with a thickness comprising at least one solder pad, wherein the at least one solder pad comprises a solder surface configured to solder the semiconductor package to a support and a surface opposite the solder surface; and
a housing molded onto the lead frame,
wherein the housing encloses the semiconductor chip and covers the opposite surface of the solder pad, wherein the solder pad comprises a hollow through hole extending from the solder surface to the opposite surface through the thickness of the leadframe and the housing comprises an opening arranged above the hollow through hole, the opening extending through the housing.

20. The semiconductor package of claim 19, wherein a width of the through hole is about half of a width of the solder pad, and a width of the opening is determined to allow an optical vision of the through hole.

* * * * *